United States Patent
Lai et al.

(10) Patent No.: US 11,749,582 B2
(45) Date of Patent: Sep. 5, 2023

(54) PACKAGE STRUCTURE

(71) Applicant: Taiwan Semiconductor Manufacturing Company, Ltd., Hsinchu (TW)

(72) Inventors: Yu-Chia Lai, Miaoli County (TW); Chen-Hua Yu, Hsinchu (TW); Chung-Shi Liu, Hsinchu (TW); Hsiao-Chung Liang, Hsinchu (TW); Hao-Yi Tsai, Hsinchu (TW); Chien-Ling Hwang, Hsinchu (TW); Kuo-Lung Pan, Hsinchu (TW); Pei-Hsuan Lee, Tainan (TW); Tin-Hao Kuo, Hsinchu (TW); Chih-Hsuan Tai, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/874,293

(22) Filed: Jul. 27, 2022

(65) Prior Publication Data
US 2022/0359343 A1    Nov. 10, 2022

Related U.S. Application Data

(63) Continuation of application No. 16/941,541, filed on Jul. 29, 2020, now Pat. No. 11,444,002.

(51) Int. Cl.
*H01L 23/40* (2006.01)
*H01L 23/58* (2006.01)
*H01L 25/18* (2023.01)
*H01L 23/00* (2006.01)

(52) U.S. Cl.
CPC .......... *H01L 23/4006* (2013.01); *H01L 23/58* (2013.01); *H01L 24/16* (2013.01); *H01L 25/18* (2013.01); *H01L 2023/405* (2013.01); *H01L 2023/4068* (2013.01); *H01L 2023/4087* (2013.01); *H01L 2224/023* (2013.01); *H01L 2224/16145* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Bo B Jang
(74) *Attorney, Agent, or Firm* — JCIPRNET

(57) ABSTRACT

A package structure includes a bottom plate, a semiconductor package, a top plate, a screw and an anti-loosening coating. The semiconductor package is disposed over the bottom plate. The top plate is disposed over the semiconductor package, and includes an internal thread in a screw hole of the top plate. The screw penetrates through the bottom plate, the semiconductor package and the top plate, and includes an external thread. The external thread of the screw is engaged to the internal thread of the top plate, and the anti-loosening coating is adhered between the external thread and the internal thread.

20 Claims, 8 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 2007/0110542 A1* | 5/2007 | Weimann | F16B 39/24 |
| | | | 411/145 |
| 2013/0140044 A1* | 6/2013 | Carrerot | F16N 7/00 |
| | | | 169/26 |
| 2019/0385929 A1* | 12/2019 | Ku | H01L 25/0655 |

* cited by examiner

PACKAGE STRUCTURE

CROSS-REFERENCE TO RELATED APPLICATION

This application is a continuation application of and claims the priority benefit of a prior application Ser. No. 16/941,541, filed on Jul. 29, 2020 and now allowed. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

Currently, integrated fan-out packages are becoming increasingly popular for their compactness. In addition, the integrated fan-out packages may be further assembled with other components such as a heat spreader, a heat sink and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
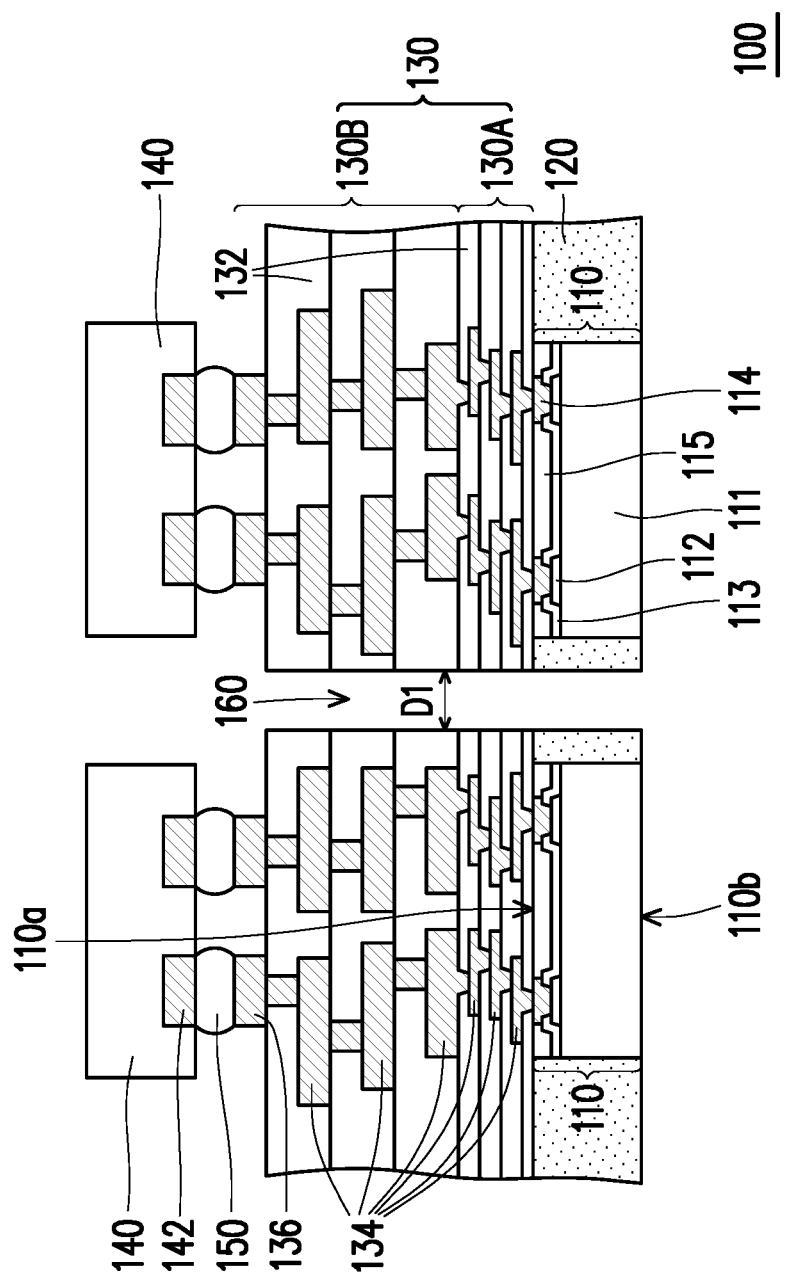
FIGS. 1-3 and 6 are cross-sectional views schematically illustrating a process flow for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1-3 and 6 are cross-sectional views schematically illustrating a process flow for fabricating a package structure 10 in accordance with some embodiments of the present disclosure. FIG. 4 is an enlarged view of the region X illustrated in FIG. 3 in accordance with some embodiments of the present disclosure. FIG. 5 is a top view of the buffer element of FIG. 3 in accordance with some embodiments of the disclosure. FIG. 7 is a schematic view of the screw of FIG. 6 in accordance with some embodiments of the disclosure. FIG. 8 is a schematic view of the washer of FIG. 6 in accordance with some embodiments of the disclosure.

Referring to FIG. 1, a semiconductor package 100 is provided. In some embodiments, the semiconductor package 100 may be or may include an integrated fan-out (InFO) package. In some embodiments, the semiconductor package 100 is a wafer level package. In some embodiments, the semiconductor package 100 includes a plurality of dies 110, an insulating encapsulant 120 and a redistribution structure 130. The dies 110 may be laterally encapsulated by the insulating encapsulant 120. The redistribution structure 130 may be disposed over the dies 110 and the insulating encapsulant 120.

In some embodiments, in FIG. 1, two dies 110 are shown, but the number of the dies 110 is not limited to be two but can be more than two. In some embodiments, the dies 110 may have the same function or different functions. In some embodiments, the dies 110 are semiconductor dies. The dies 110, for example, each include a semiconductor substrate 111, a plurality of conductive pads 112, a passivation layer 113, a plurality of conductive pillars 114, and a protection layer 115. In some embodiments, the conductive pads 112 are disposed over the semiconductor substrate 111. The passivation layer 113 may be formed over the semiconductor substrate 111 and may have contact openings that partially expose the conductive pads 112. The conductive pillars 114 may be formed on the conductive pads 112. In addition, the protection layer 115 may be formed on the passivation layer 113. In some embodiments, the conductive pillars 114 may be exposed from the protection layer 115. In some embodiments, the protection layer 115 may be optional.

In some embodiments, the semiconductor substrate 111 may be a silicon substrate including active components (e.g., transistors or the like) and/or passive components (e.g., resistors, capacitors, inductors, or the like) formed therein. The conductive pads 112 may be aluminum pads, copper pads, or other suitable metallic pads. In some embodiments, the conductive pillars 114 are plated copper pillars. In some embodiments, the passivation layer 113 and/or the protection layer 115 may be a polybenzoxazole (PBO) layer, a polyimide (PI) layer or other suitable polymers. In some alternative embodiments, the passivation layer 113 and/or the protection layer 115 may be made of inorganic materials, such as silicon oxide, silicon nitride, silicon oxynitride, or any suitable dielectric material. In some embodiments, the materials of the passivation layer 113 and/or the protection layer 115 may be the same. In some embodiments, the materials of the passivation layer 113 and/or the protection layer 115 may be different.

It is noted that, the die 110 described herein may be referred as a semiconductor chip or an integrated circuit (IC). In an alternative embodiment, the die 110 described herein may include one or more semiconductor devices. In certain embodiments, the die 110 may be or may include a logic die (e.g., central processing unit (CPU), graphic processing unit (GPU), microcontroller, etc.), a memory die (e.g., dynamic random access memory (DRAM) die, static random access memory (SRAM) dies, high bandwidth memory (HBM) die, etc.), a radio frequency (RF) die, a micro-electro-mechanical-system (MEMS) die, a signal processing die (e.g., digital signal processing (DSP) die), a front-end die (e.g., analog front-end (AFE) die), a system-on-chip (SoC) die, or combinations thereof. In some embodiments, the dies 110 may include the same types of dies. In some embodiments, the dies 110 may include different types of dies.

In some embodiments, the insulating encapsulant 120 may include a molding compound, a molding underfill, a resin (such as epoxy), or the like. In some embodiments, the insulating encapsulant 120 includes a base material and filler particles distributed in the base material. In some embodiments, the material of the base material includes epoxy resins, phenolic resins or silicon-containing resins, or the like, and the material of the filler particles includes silica, alumina, zinc oxide, titanium dioxide, or the like. In some embodiments, the method of forming the insulating encapsulant 120 includes the following steps. First, an encapsulation material (not shown) is formed to encapsulate the dies 110. Sidewalls and top surfaces of the dies 110 are covered by the encapsulation material. The encapsulation material may be formed by a molding process. For example, the encapsulation material may be formed by a compression molding process, a transfer molding process, or the like. A curing process is optionally performed to harden the encapsulation material for optimum protection. Then, a planarization process is performed on the encapsulation material to remove portions of the encapsulation material, until the conductive pillars 114 of the dies 110 are exposed. Due to the planarization, the encapsulation material may be reduced in thickness to form the insulating encapsulant 120 laterally encapsulating the dies 110. In some embodiments, the planarization process is a mechanical grinding process and/or a chemical mechanical polishing (CMP) process. In some embodiments, portions of the conductive pillars 114 and/or the protection layers 115 are slightly ground as well. After the planarization process, top surfaces of the conductive pillars 114 and top surfaces of the protection layers 115 are substantially levelled with a top surface of the insulating encapsulant 120. In some alternative embodiments, the top surface of the insulating encapsulant 120 may not level with the top surfaces of the conductive pillars 114 and/or the top surfaces of the protection layers 115.

In some embodiments, the redistribution structure 130 is formed on the dies 110 and the insulating encapsulant 120 to be electrically connected to the conductive pillars 114 of the dies 110. In some embodiments, the method of forming the redistribution structure 130 includes forming dielectric layers 132 and redistribution layers 134 embedded in the dielectric layers 132. The redistribution structure 130 is shown as an example. More dielectric layers and redistribution layers may be formed in the redistribution structure 130. If more dielectric layers and redistribution layers are to be formed, steps and processes discussed below may be repeated here.

In some embodiments, the dielectric layer 132 of the redistribution structure 130 is formed of a photo-sensitive material, such as polybenzoxazole (PBO), polyimide, benzocyclobutene (BCB), or the like, which may be patterned using a lithography mask.

The dielectric layer 132 may be formed by spin coating, lamination, chemical vapor deposition (CVD), the like, or a combination thereof. The dielectric layer 132 is then patterned. The patterning forms via openings extending through the dielectric layer 132.

The redistribution layer 134 of the redistribution structure 130 may include conductive lines on and extending along the major surface of the dielectric layer 132. The redistribution layer 134 may further include conductive vias extending through the dielectric layer 132. To form the redistribution layer 134, a seed layer is formed over the dielectric layer 132 and in the via openings extending through the dielectric layer 132. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD, or the like. A photoresist is then formed and patterned on the seed layer. The photoresist may be formed by spin coating or the like and may be exposed to light for patterning. The pattern of the photoresist corresponds to the redistribution layer 134. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, like copper, titanium, tungsten, aluminum, or the like. The combination of the conductive material and underlying portions of the seed layer form the redistribution layer 134. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process (e.g., wet or dry etching). Furthermore, the redistribution structure 130 may include under bump metallurgies (UBMs) 136 in/on an uppermost layer of the dielectric layers 132. The UBMs 136 are formed to electrically connect the redistribution layers 134. The redistribution layers 134 and the UBMs 136 may be formed of similar processes.

In some embodiments, the redistribution structure 130 includes a first portion 130A and a second portion 130B stacked on the first portion 130A. Each of the dielectric layers 132 of the second portion 130B of the redistribution structure 130 may be thicker than any of the dielectric layers 132 of the first portion 130A of the redistribution structure 130. The redistribution layers 134 of the second portion 130B of the redistribution structure 130 may be thicker and/or wider than the redistribution layers 134 of the first portion 130A of the redistribution structure 130. In some embodiments, the second portion 130B on the first portion 130A is used for long-range electrical routing, and the first portion 130A of the redistribution structure 130 is used for short-range electrical routing.

In some embodiments, the dies 110, the insulating encapsulant 120 and the redistribution structure 130 are formed over a carrier substrate (not shown) at the beginning. In some embodiments, the carrier substrate is a glass substrate, a ceramic substrate, or the like. However, other material may be adapted as a material of the carrier substrate as long as the material is able to withstand the following manufacturing processes while supporting the elements formed thereon. In some embodiments, the carrier substrate has a de-bonding layer formed thereon. The de-bonding layer may be formed of a polymer-based material, which may be removed along with the carrier substrate from the overlying structures that will be formed in subsequent steps. In some embodiments, the de-bonding layer is an epoxy-based thermal-release material, which loses its adhesive property when heated, such as a light-to-heat-conversion (LTHC) release coating. In other embodiments, the de-bonding layer may be an ultra-violet (UV) glue, which loses its adhesive property when exposed to UV light. The de-bonding layer may be dispensed as a liquid and cured, may be a laminate film laminated onto the carrier substrate, or may be the like. The top surface of the de-bonding layer may be levelled and may have a high degree of planarity. In some embodiments, rear surfaces 110b of the dies 110 are attached on the de-bonding layer through die attachment films (not shown), and front surfaces (active surfaces) 110a of the dies 110 opposite to the rear surfaces 110b face up.

In some embodiments, after the redistribution structure 130 are formed, the a carrier substrate de-bonding process is performed to detach or de-bond the carrier substrate and the de-bonding layer from the wafer form structure which includes the dies 110, the insulating encapsulant 120 and the redistribution structure 130. In some embodiments, the de-bonding process includes irradiating a light such as a laser light or an UV light on the de-bonding layer so that the de-bonding layer decomposes under the heat of the light and the carrier substrate can be removed. Nevertheless, the carrier substrate de-bonding process is not limited thereto. Other suitable de-carrier methods may be used in some alternative embodiments. In some embodiments, the die attachment films on the rear surfaces 110b of the dies 110 may be subsequently removed, and the rear surface 110b of the dies 110 are exposed. The wafer form structure may be then placed on a tape (not shown).

In some embodiments, after the carrier substrate de-bonding process, devices 140 are placed over the redistribution structure 130. In some embodiments, the devices 140 are physically and electrically connected to the redistribution structure 130. In some embodiments, the devices 140 are separated from each other. In some embodiments, the devices 140 include pads 142, such as aluminum pads, to serve as external connections of the devices 140. In some embodiments, the devices 140 may include sockets and power sources installed in the sockets. The sockets are electrical and physical interfaces for the power sources. In some embodiments, the power sources are connected to the sockets to provide power to the underlying dies 110. In some embodiments, the power sources may include pins inserted into the pin holes in the sockets. However, in alternative embodiments, depending on the functional system design, other components, such as memory components, voltage regulator components, integrated passive device (IPD) components, may be installed in the sockets.

In some embodiments, the devices 140 are bonded onto the redistribution structure 130 through a plurality of connecting elements 150. In some embodiments, the connecting elements 150 are formed on the UBMs 136 of the redistribution structure 130. The connecting elements 150 may be controlled collapse chip connection (C4) bumps, microbumps, solder balls, ball grid array (BGA) balls, or other suitable terminals for providing external connections to the redistribution structure 130. In some embodiments, a soldering process and a reflow process are optionally performed for enhancement of the adhesion between the connecting elements 150 and the redistribution structure 130.

In some embodiments, one or more holes 160 are formed in the semiconductor package 100. In some embodiments, the one or more holes 160 penetrate through the insulating encapsulant 120 and the redistribution structure 130, for example. In some embodiments, the one or more holes 160 are formed by removing portions of the insulating encapsulant 120 and the dielectric layers 132 of the redistribution structure 130. In some embodiments, portions of the redistribution layers 134 of the redistribution structure 130 are also removed. In addition, in some embodiments, portions of the tape are also removed during the formation of the one or more holes 160, so as to assure the one or more holes 170 penetrating the insulating encapsulant 120. In some embodiments, a forming method of the one or more holes 160 includes a laser drilling process, a mechanical drilling process, or other suitable hole-forming method. In some embodiments, after forming the one or more holes 160, a sidewall of the insulating encapsulant 120 in the hole 160 is flush with a sidewall of the redistribution layers 134 of the redistribution structure 130 in the hole 160. In some embodiments, the hole 160 has a constant diameter D1. In other words, the insulating encapsulant 120 and the redistribution structure 130 have substantially straight sidewalls in the hole 160. In some embodiments, the one or more holes 160 are separated from the UBMs 136 of the redistribution structure 130. In some embodiments, the one or more holes 160 are separated from the dies 110 by a distance. In some embodiments, in a subsequent process, the tape is removed from the dies 110 and the insulating encapsulant 120, and the resulting semiconductor package 100 is illustrated in FIG. 1.

Figure 2:
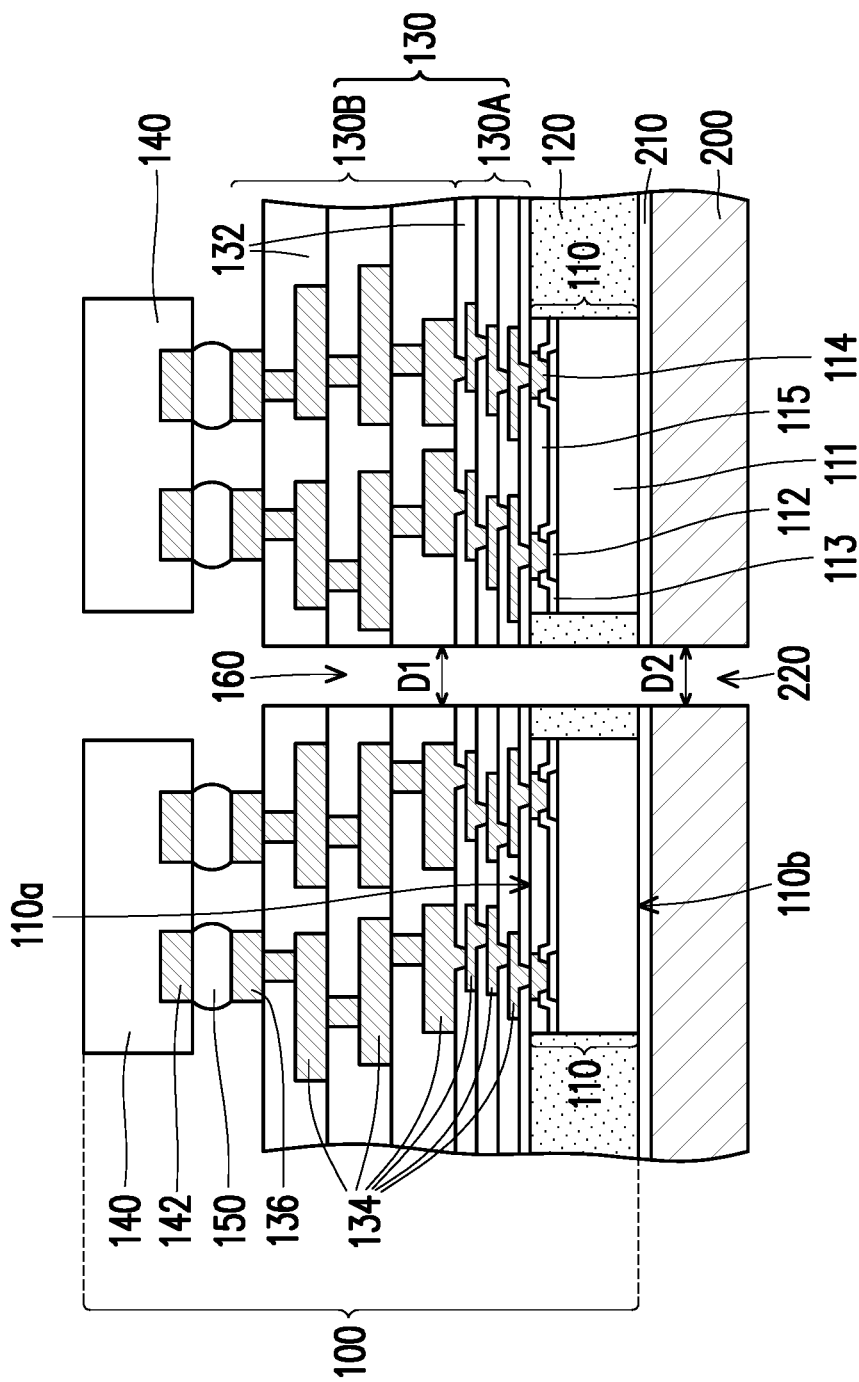

Referring to FIG. 2, after the tape is removed, the semiconductor package 100 is attached onto a bottom plate 200. In some embodiments, the bottom plate 200 helps dissipate heat from the semiconductor package 100. In some embodiments, an effective thermal conductivity of the bottom plate 200 is higher than that of the semiconductor package 100. In some embodiments, an effective thermal conductivity of the bottom plate 200 is higher than that of the dies 110 of the semiconductor package 100. In some embodiments, the bottom plate 200 may be a heat dissipating plate, such as a heat sink, a heat spreader, a cold plate, or the like. In some embodiments, the bottom plate 200 may be formed of a metallic material such as copper, aluminum, stainless steel, nickel, or the like. In some embodiments, the bottom plate 200 is attached to the semiconductor package 100 through a thermal interface material (TIM) 210 having good thermal conductivity. In some embodiments, the TIM 210 is dispensed on a back side of the semiconductor package 100, physically and thermally coupling the bottom plate 200 to the dies 110. In some embodiments, the TIM 210 is in contact with the bottom plate 200, the dies 110 and the insulating encapsulant 120. In some embodiments, the dies 110 and the insulating encapsulant 120 are between the bottom plate 200 and the redistribution structure 130.

In some embodiments, the bottom plate 200 has one or more holes (apertures) 220 penetrating through the bottom plate 200. In some embodiments, the one or more holes 220 correspond to the one or more holes 160 of the semiconductor package 100.

In other words, each of the one or more holes 220 of the bottom plate 200 is substantially aligned with the corresponding hole 160 of the semiconductor package 100. In some embodiments, the hole 220 has a constant diameter. In other words, the bottom plate 200 has a substantially straight sidewall in the hole 220. In some embodiments, a size (e.g., diameter D2) of the hole 220 of the bottom plate 200 may be substantially the same as a size (e.g., diameter D1) of the corresponding hole 160 of the semiconductor package 100. In some alternative embodiments, a size (e.g., diameter D2) of the hole 220 of the bottom plate 200 may be different from a size (e.g., diameter D1) of the corresponding hole 160 of the semiconductor package 100.

Figure 3:
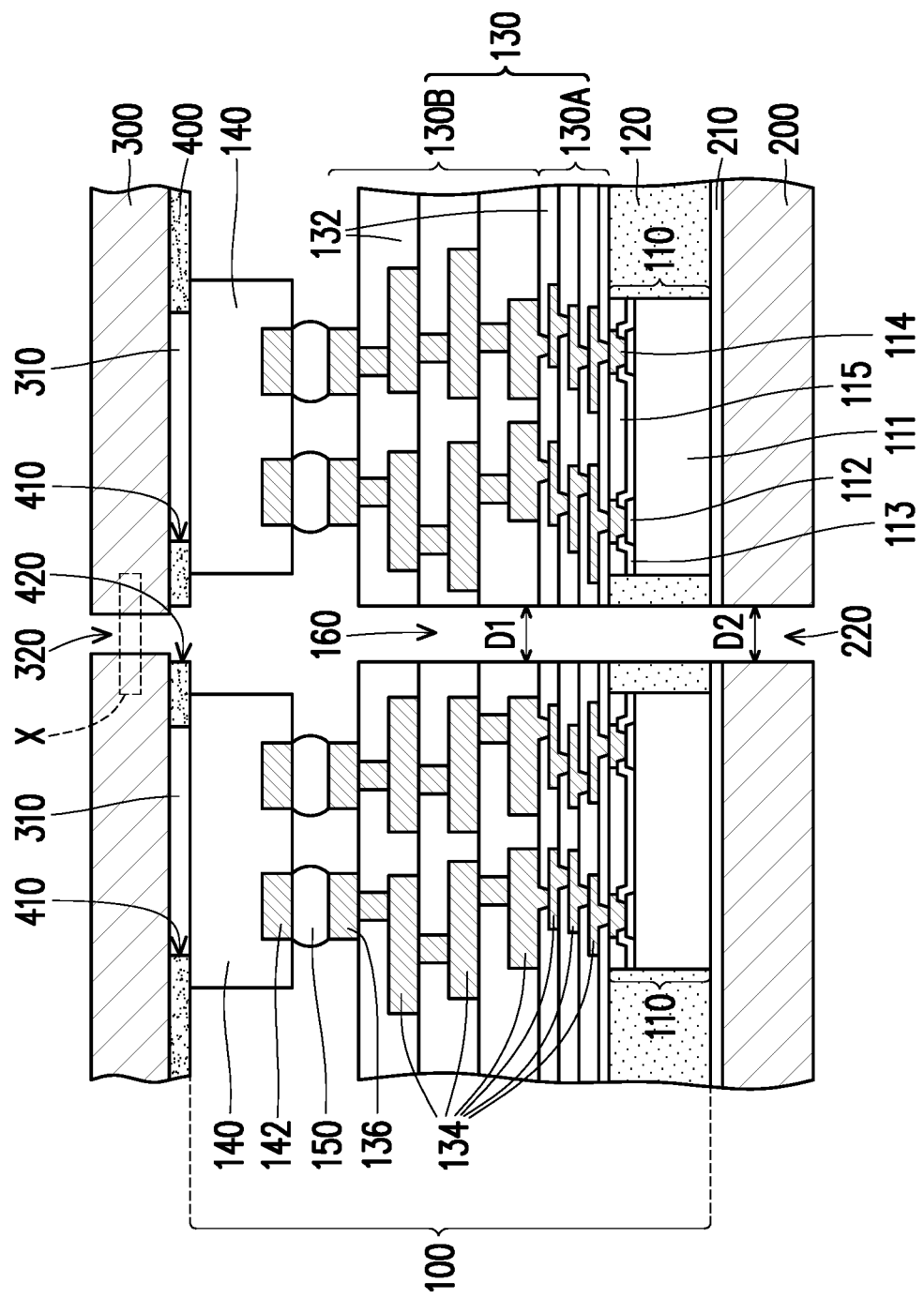
Figure 4:
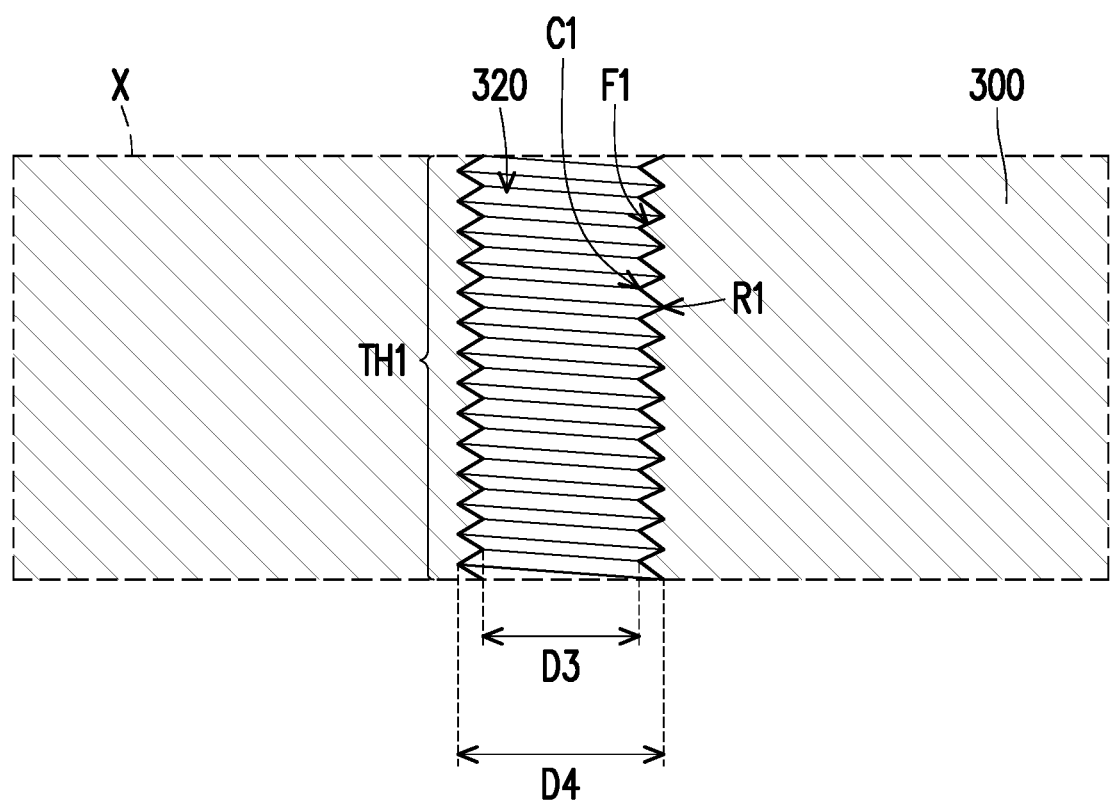
FIG. 4 is an enlarged view of the region X illustrated in FIG. 3 in accordance with some embodiments of the present disclosure.
Figure 5:
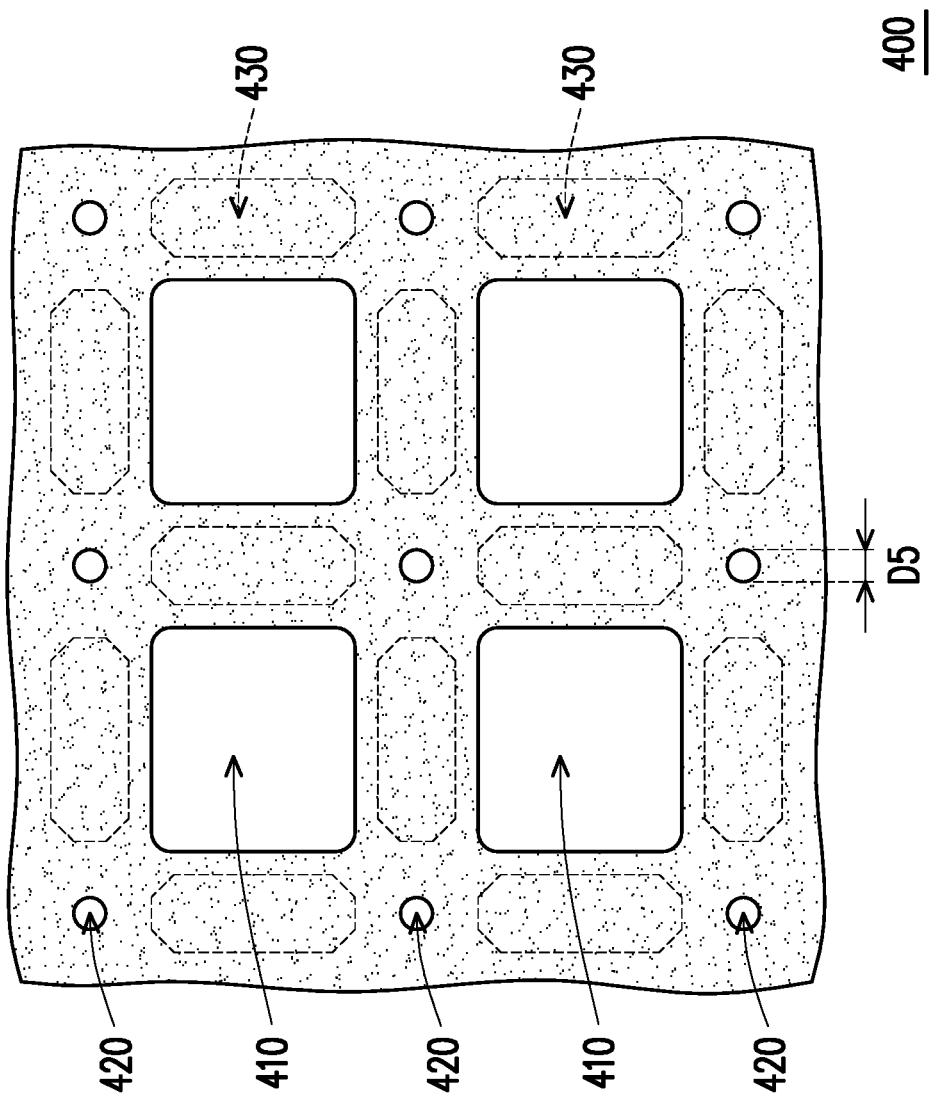
FIG. 5 is a top view of the buffer element of FIG. 3 in accordance with some embodiments of the disclosure.

Referring to FIG. 3 and FIG. 4, a top plate 300 is attached onto the semiconductor package 100. In some embodiments, the top plate 300 helps dissipate heat from the semiconductor package 100. In some embodiments, an effective thermal conductivity of the top plate 300 is higher than that of the semiconductor package 100. In some embodiments, an effective thermal conductivity of the top plate 300 is higher than that of the devices 140 of the semiconductor package 100. In some embodiments, the top plate 300 may be a heat dissipating plate, such as a heat sink, a heat spreader, a cold plate, or the like. In some embodiments, the top plate 300 may be formed of a metallic material such as copper, aluminum, stainless steel, nickel, or the like. In some embodiments, the top plate 300 and the bottom plate 200 are formed of the same material or different materials. In some embodiments, the top plate 300 and the bottom plate 200 have the same size/shape or different sizes/shapes. In some embodiments, the top plate 300 is attached to the semiconductor package 100 through TIMs 310 having good thermal conductivity. In some embodiments, the TIMs 310 are dispensed on a front side of the semiconductor package 100, physically and thermally coupling the top plate 300 to the devices 140. In some embodiments, each of the TIMs 310 is in contact with the top plate 300 and corresponding one of the devices 140.

In some embodiments, the top plate 300 has one or more screw holes 320 penetrating through the top plate 300. In some embodiments, the one or more screw holes 320 correspond to the one or more holes 160 of the semiconductor package 100 and the one or more holes 220 of the bottom plate 200. In other words, each of the one or more screw holes 320 of the top plate 300 is substantially aligned with the corresponding hole 160 of the semiconductor package 100 and the corresponding hole 220 of the bottom plate 200. In some embodiments, the top plate 300 has an internal thread (female thread) TH1 on the internal surface of the top plate 300 in each screw hole 320. In some embodiments, a size of the screw hole 320 of the top plate 300 may be smaller than a size (e.g., diameter D1) of the corresponding hole 160 of the semiconductor package 100, and may be smaller than a size (e.g., diameter D2) of the corresponding hole 220 of the bottom plate 200, wherein the size of the screw hole 320 of the top plate 300 may refer to a minor diameter D3 or a major diameter D4 of the internal thread TH1. The minor diameter D3 is the smallest diameter of the internal thread TH1 in the screw hole 320, and the major diameter D4 is the largest diameter of the internal thread TH1 in the screw hole 320. In other words, the minor diameter D3 is determined by the crests C1 of the internal thread TH1, and the major diameter D4 is determined by the roots R1 of the internal thread TH1. The crests C1 the internal thread TH1 are connected with the roots R1 of the internal thread TH1 by flanks F1 of the internal thread TH1.

Referring to FIG. 3 and FIG. 5, in some embodiments, a buffer element 400 is assembled between the semiconductor package 100 and the top plate 300. In some embodiments, a buffer element 400 is in contact with the semiconductor package 100 and the top plate 300. In some embodiments, the buffer element 400 helps compensate for a total thickness variation (TTV) of the semiconductor package 110. The TTV of the semiconductor package 110 is the difference between the smallest thickness and the largest thickness of the semiconductor package 110. The TTV is measured throughout the length of the semiconductor package 110. In some embodiments, the buffer element 400 may undergo deformation when a load is applied to it in compression. In some embodiments, the material of the buffer element 400 is chosen to have a Young's modulus ranging from about 0.01 GPa to about 4 GPa to better compensate for the thickness variation. In some embodiments, the Young's modulus of the buffer element 400 is less than that of the top plate 300. In some embodiments, the Young's modulus of the buffer element 400 is less than that of the devices 140. In some embodiments, the material of the buffer element 400 may include aluminum, Polytetrafluoroethylene (PTFE), or other suitable material.

In some embodiments, the buffer element 400 includes openings 410 extending through the buffer element 400, and the TIMs 310 are respectively disposed in the openings 410 of the buffer element 400. In some embodiments, the TIM 310 may be in contact with a sidewall of the buffer element 400 in the opening 410. In some embodiments, the TIM 310 may be not in contact with the sidewall of the buffer element 400 in the opening 410. In some embodiments, locations of the openings 410 of the buffer element 400 correspond to locations of the devices 140 respectively, such that the TIMs 310 are adhered between the corresponding devices 140 and the top plate 300. In some embodiments, a size (e.g., lateral dimension) of the opening 410 is smaller than a size (e.g., lateral dimension) of the devices 140, for example. In some embodiments, the openings 410 of the buffer element 400 are arranged in an array. In some embodiments, the opening 410 of the buffer element 400 may have a shape such as rectangular or other suitable shape, for example.

In some embodiments, the buffer element 400 has one or more holes (apertures) 420 penetrating through the buffer element 400. In some embodiments, the one or more holes 420 correspond to the one or more screw holes 320 of the top plate 300, the one or more holes 160 of the semiconductor package 100 and the one or more holes 220 of the bottom plate 200. In other words, each of the one or more holes 420 of the buffer element 400 is substantially aligned with the corresponding screw hole 320 of the top plate 300, the corresponding hole 160 of the semiconductor package 100 and the corresponding hole 220 of the bottom plate 200. In some embodiments, the hole 420 has a constant diameter. In other words, the buffer element 400 has a substantially straight sidewall in the hole 420. In some embodiments, a size (e.g., diameter D5) of the hole 420 of the buffer element 400 may be substantially the same as a size (e.g., diameter D1) of the corresponding hole 160 of the semiconductor package 100 and/or a size (e.g., diameter D2) of the corresponding hole 220 of the bottom plate 200. In some alternative embodiments, a size (e.g., diameter D5) of the hole 420 of the buffer element 400 may be different from a size (e.g., diameter D1) of the corresponding hole 160 of the semiconductor package 100 and/or a size (e.g., diameter D2) of the corresponding hole 220 of the bottom plate 200. In some embodiments, a size (e.g., diameter D5) of the hole 420 of the buffer element 400 may be larger than a size (e.g., the minor diameter D3 and/or the major diameter D4) of the corresponding screw hole 320 of the top plate 300.

In some embodiments, the openings 410 and the one or more holes 420 of the buffer element 400 are separated from each other. In some embodiments, the one or more holes 420 of the buffer element 400 are located adjacent to the corners of the openings 410 of the buffer element 400. In some embodiments, the one or more holes 420 are respectively located between the corners of four adjacent openings 410. In some embodiments, one hole 420 is located between the corners of two adjacent openings 410 on a diagonal line. For example, the hole 420 may be located between the corner of the opening 410 on the upper left side and the corner of the opening 410 on the lower right side, and/or the hole 420 may be located between the corner of the opening 410 on the upper right side and the corner of the opening 410 on the lower left side.

In certain embodiments, the buffer element 400 may further has one or more openings 430 (indicated by dash lines) extending through the buffer element 400 to partially expose the top surface of underlying semiconductor package 100. In this case, the top plate 300 may further include one or more openings (not shown) corresponding to the one or more openings 430 of the buffer element 400, such that external connections may be able to connect to the semiconductor package 100 through the one or more openings 430 of the buffer element 400 and the corresponding one or more openings of the top plate 300. In some embodiments, the one or more openings 430 are respectively located between two adjacent openings 410, and the one or more openings 430 are respectively located between two adjacent holes 420. In some embodiments, one opening 410 is surrounded by four adjacent openings 430. In some embodiments, the one or more openings 430 may have a shape such as polygon or other suitable shape, for example. In alternative embodiments, the one or more openings 430 of the buffer element 400 are omitted.

Figure 6:
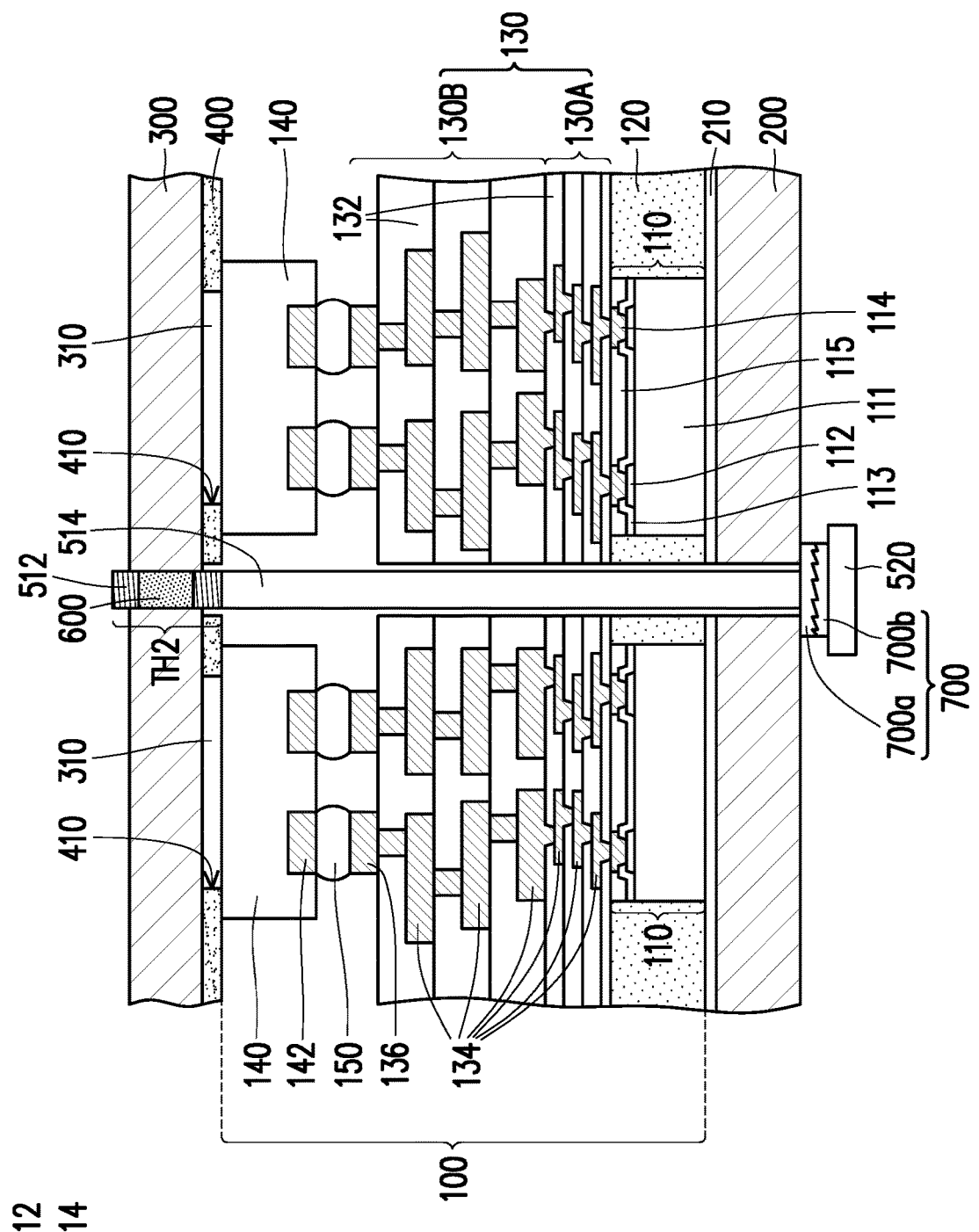
Figure 7:
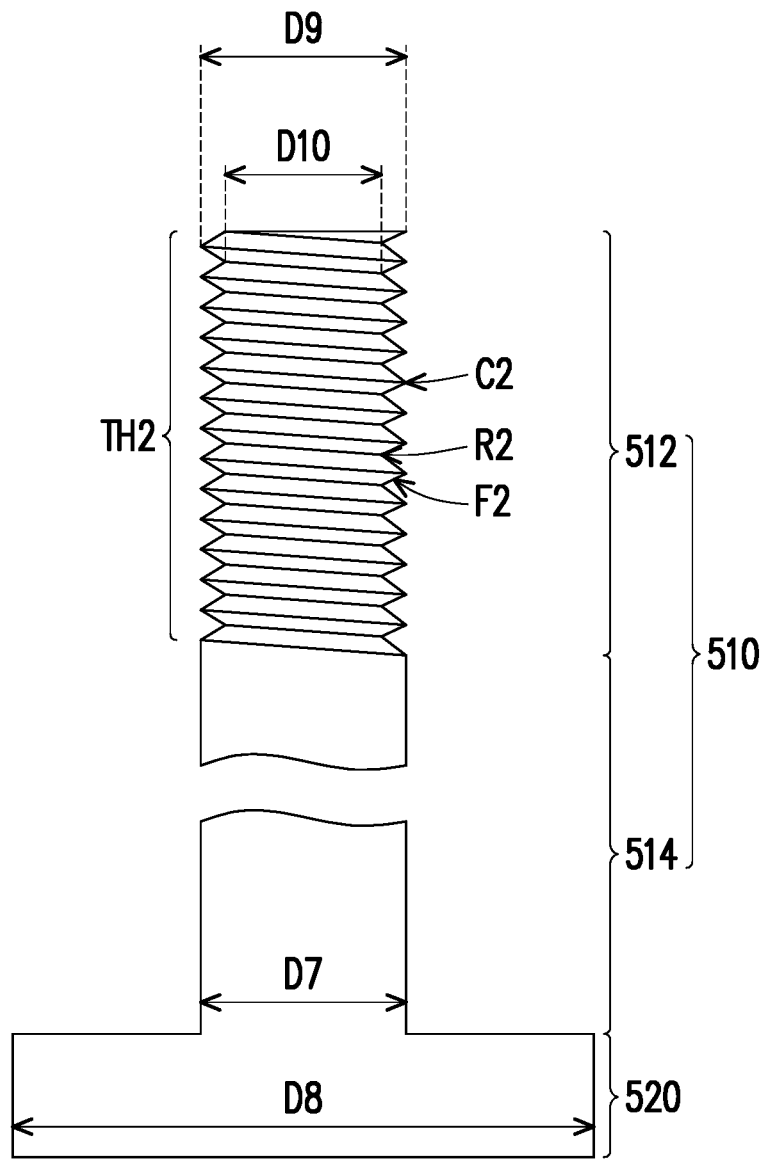
FIG. 7 is a schematic view of the screw of FIG. 6 in accordance with some embodiments of the disclosure.
Figure 8:
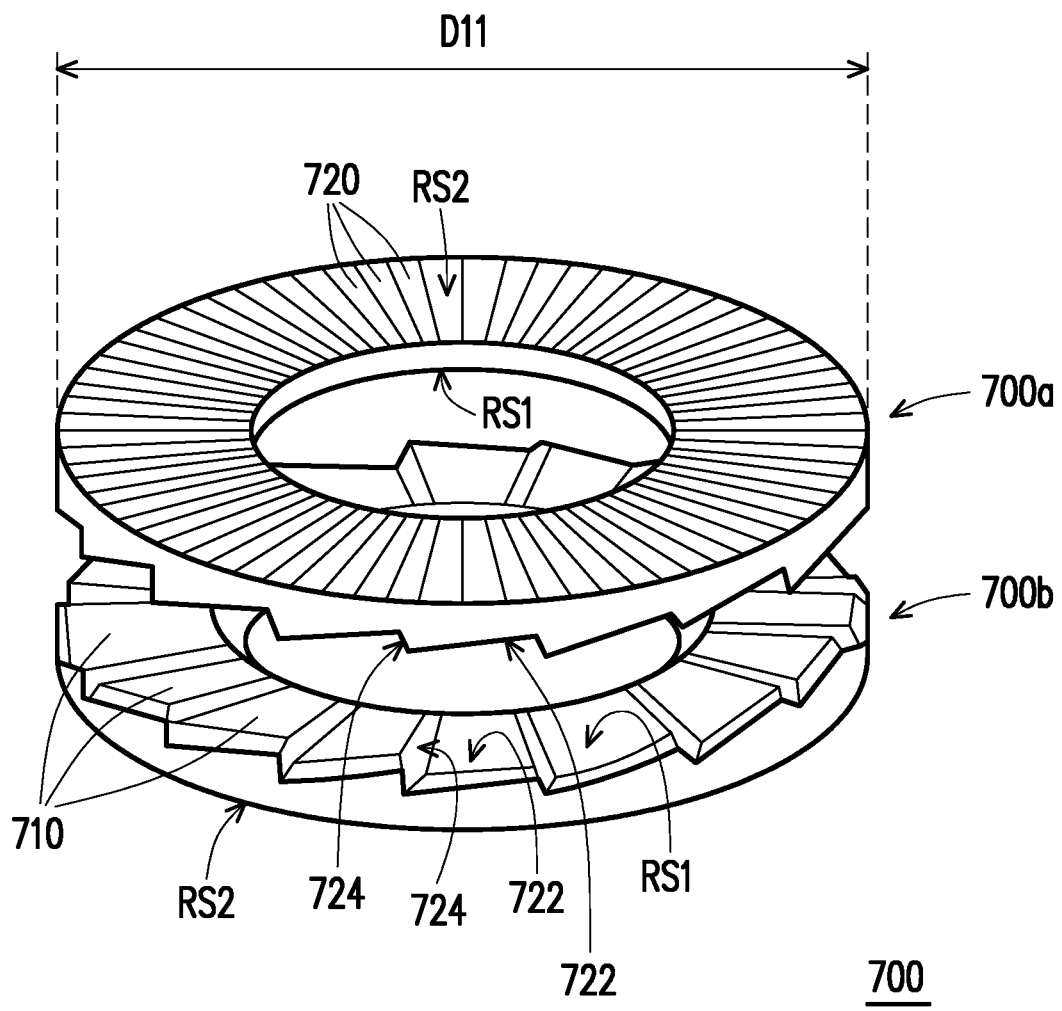
FIG. 8 is a schematic view of the washer of FIG. 6 in accordance with some embodiments of the disclosure.

Referring to FIG. 3, FIG. 6 and FIG. 7, one or more screws 500 are provided to secure the semiconductor package 100 between the bottom plate 200 and the top plate 300. In some embodiments, the screw 500 includes a main portion 510 and a head portion 520 connected to the main portion 510. In some embodiments, the screw 500 has an external thread (male thread) TH2 on the external surface of the main portion 510. In some embodiments, the main portion 510 includes a first portion 512 and a second portion 514, wherein the second portion 514 is connected between the first portion 512 and the head portion 520. In some embodiments, the external thread TH2 is disposed on the external surface of the first portion 512, and no external thread is disposed on the external surface of the second portion 514. In other words, the external thread TH2 is disposed opposite to the head portion 520. In some embodiments, the second portion 512 of the main portion 510 has a constant diameter D7. In other words, the second portion 514 of the main portion 510 has a substantially straight sidewall.

In some embodiments, a maximum width D8 of the head portion 520 is greater than a maximum diameter of the main portion 510, wherein the maximum diameter of the main portion 510 may refer to the diameter D7 of the second portion 512 or a major diameter D9 of the external thread TH2. The major diameter D9 of the external thread TH2 may be equal to or different from the diameter D7 of the second portion 512. In addition, the minor diameter D10 of the external thread TH2 may be equal to or different from the diameter D7 of the second portion 512. The minor diameter D10 is the smallest diameter of the external thread TH2, and the major diameter D9 is the largest diameter of the external thread TH2. In other words, the minor diameter D10 is determined by the crests C2 of the external thread TH2, and the major diameter D9 is determined by the roots R2 of the external thread TH2. The crests C2 the external thread TH2 are connected with the roots R2 of the external thread TH2 by flanks F2 of the external thread TH2.

In some embodiments, the main portion 510 of screw 500 is inserted into the holes 160, 220 and 420 from bottom and is thread into the screw hole 320 of the top plate 300. During fastening, the one or more screws 500 are tightened, thereby increasing the mechanical force applied to the semiconductor package 100 by the opposite bottom plate 200 and the top plate 300. In some embodiments, the one or more screws 500 are tightened until the bottom plate 200 and the top plate 300 exert a desired amount of pressure on the TIM 210 and TIMs 320 respectively. In some embodiments, the main portion 510 of screw 500 penetrates through the bottom plate 200, the TIM 210, the semiconductor package 100, the buffer element 400 and the top plate 300. In some embodiments, the bottom plate 200 is between the head portion 520 of the screw 500 and the semiconductor package 100.

In some embodiments, a maximum diameter (i.e., the diameter D7 of the second portion 512 or a major diameter D9 of the external thread TH2) of the main portion 510 is smaller than the diameter D1 of the hole 160 of the semiconductor package 100, the diameter D2 of the hole 220 of the bottom plate 200 and the diameter D5 of the hole 420 of the buffer element 500, and thus the main portion 510 may be inserted into the holes 160, 220 and 420. In some embodiments, the minor diameter D10 and the major diameter D9 of the external thread TH2 of the screw 500 may be slightly smaller than the minor diameter D3 and the major diameter D4 of the internal thread TH1 of the top plate 300, respectively. In addition, the internal thread TH1 of the top plate 300 and the external thread TH2 of the screw 500 have the same pitch. The pitch of the internal thread TH1 is the distance from the crest C1 of one internal thread TH1 to the next, and the pitch of the external thread TH2 is the distance from the crest C2 of one external thread TH2 to the next. Therefore, the internal thread TH1 of the top plate 300 and the external thread TH2 of the screw 500 may fit together, and thus the top plate 300 may be secured onto the semiconductor package 100. In some embodiments, the maximum width D8 of the head portion 520 is at least larger than the diameter D2 of the hole 220, and thus, after fastening, the bottom plate 200 may be secured onto the semiconductor package 100 through the head portion 520. Accordingly, the screw 500 secures the top plate 300 and the bottom plate 200 onto opposite sides of the semiconductor package 100. In some embodiments, the maximum width D8 of the head portion 520 is also larger than the diameter D1 of the hole 160, the minor diameter D3 and the major diameter D4 of the screw hole 320 and the diameter D5 of the hole 420. In some embodiments, a material of the screw 500 may be stainless steel or other suitable material, for example.

In some embodiments, the screw 500 is disposed in the insulating encapsulant 120 among the dies 110, and the screw 500 is adjacent to the corners of the dies 110. In addition, the screw 500 is disposed in the dielectric layers 132 aside conductive patterns (e.g., conductive lines or vias) of the redistribution layers 134 of the redistribution structure 130. In some embodiments, the screw 500 is disposed between the adjacent conductive patterns of the redistribution layers 134. In some embodiments, the screw 500 is electrically insulated from the dies 110 and the redistribution layers 134 by the insulating encapsulant 120 and the dielectric layers 132. In some embodiments, the screw 500 is disposed between the adjacent devices 140. In some embodiments, the screws 500 may be arranged regularly. In some alternative embodiments, the screws 500 may be arranged randomly. In some embodiments, a gap surrounds the screw 500 and is formed between the screw 500 and sidewalls of the holes 160, 220, 440. In other word, the screw 500 may be not in contact with the sidewalls of the holes 160, 220, 440. In some embodiments, the screw 200 is separated from and thus not in contact with the dielectric layers 132 of the redistribution structure 132, the insulating encapsulant 120, the device 140 and the buffer element 440. In some alternative embodiments, the screw 500 may be in contact with the dielectric layers 132 of the redistribution structure 132, the insulating encapsulant 120, the device 140 and/or the buffer element 440.

As shown in FIG. 6, in some embodiments, an anti-loosening coating 600 is adhered between the internal thread TH1 of the top plate 300 and the external thread TH2 of the screw 500. In some embodiments, the anti-loosening coating 600 is sprayed onto an outer surface of the external thread TH2 at the beginning, wherein the anti-loosening coating 600 may surround the external thread TH2 and may be continuously (or conformally) formed on the crests C2, the roots R2 and the flanks F2 of the external thread TH2. When the external thread TH2 of the screw 500 is engaged to the internal thread TH1 of the top plate 300, the anti-loosening coating 600 may fill up a gap between the internal thread TH1 and the external thread TH2. In other words, the anti-loosening coating 600 may be in contact with and between the internal thread TH1 and the external thread TH2. In some embodiments, the anti-loosening coating 600 forms a metal-to-metal interface between the external thread TH2 of the screw 500 and the internal thread TH1 of the top plate 300, and the anti-loosening coating 600 may provide a positive resistance to vibration and loosening, such that the anti-loosening coating 600 may prevent the screw 500 from loosening. In some embodiments, a material of the anti-loosening coating 600 includes polyamide, such as nylon, or other suitable material. In some embodiments, the anti-loosening coating 600 is adhered between a portion of the internal thread TH1 and a portion of the external thread TH2. In some other embodiments, the anti-loosening coating 600 is adhered between an entirety of the internal thread TH1 and an entirety of the external thread TH2.

Referring to FIG. 6 and FIG. 8, a pair of washers 700 are provided to prevent vibration from loosening the screw 500. In some embodiments, the pair of washer 700 sleeve the main portion 510 of the screw 500, and the pair of washer 700 are between the bottom plate 200 and the head portion 510 of the screw 500. In some embodiments, the pair of washer 700 include a washer 700a and a washer 700b. The washer 700a may be similar to or the same as the washer 700b. In some embodiments, each of the washer 700a and the washer 700b includes a first ring-shaped surface RS1 and a second ring-shaped surface RS2 opposite to the first ring-shaped surface RS1. In some embodiments, each of the washer 700a and the washer 700b includes cams 710 arranged on the first ring-shaped surface RS1. In some embodiments, each of the washer 700a and the washer 700b includes seizing ridges 720 distributed on the second ring-shaped surface RS2. In some embodiments, a material of the pair of washers 700 may be stainless steel or other suitable material, for example.

In some embodiments, the cams 720 are arranged along a circumferential direction of the first ring-shaped surface RS1. In some embodiments, the cams 720 extend along a radial direction of the first ring-shaped surface RS1. In some embodiments, the first ring-shaped surface RS1 of the washer 700a faces the first ring-shaped surface RS1 of the washer 700b. In other words, the cams 720 of the washer 700a face the cams 720 of the washer 700b. In some embodiments, the washer 700a and the washer 700b join together through the cams 720, wherein the cams 720 of the washer 700a are engaged to the cams 720 of the washer 700b. In some embodiments, the cams 720 from the side view may be shaped as wedges. In some embodiments, each cam 720 includes a first joint surface 722 and a second joint surface 724 connected to each other, and an angle is formed between the first joint surface 722 and the second joint surface 724. In some embodiments, the angle between the first joint surface 722 and the second joint surface 724 may be an obtuse angle, a right angle or an acute angle. In some embodiments, the first joint surface 722 of the cam 720 is connected to the second joint surface 724 of adjacent cam 720. In other words, one first joint surface 722 is connected between two adjacent second joint surfaces 724, and one second joint surfaces 724 is connected between two adjacent first joint surface 722. In some embodiments, when the washer 700a and the washer 700b join together, the first joint surface 722 of the cams 720 of the washer 700a abut against the corresponding first joint surface 722 of the cams 720 of the washer 700b, and the second joint surface 724 of the cams 720 of the washer 700a abut against the corresponding second joint surface 724 of the cams 720 of the washer 700b.

In some embodiments, the seizing ridges 720 are arranged along a circumferential direction of the second ring-shaped surface RS2. In some embodiments, the seizing ridges 720 extend along a radial direction of the second ring-shaped surface RS2. In some embodiments, the second ring-shaped surface RS2 of the washer 700a is opposite to the second ring-shaped surface RS2 of the washer 700b. In other words, the seizing ridges 720 of the washer 700a or the washer 700b face the bottom plate 200 or the head portion 520 of the screw 500. In some embodiments, the seizing ridges 720 protrude upward from the second ring-shaped surface RS2. In some embodiments, the seizing ridges 720 of one washer among the pair of washers 700 abut against the bottom plate 200, and the seizing ridges 720 of another washer among the pair of washers 700 abut against the head portion 520 of the screw 500. For example, the seizing ridges 720 of the washer 700a may abut against the bottom plate 200, and the seizing ridges 720 of the washer 700b may abut against the head portion 520 of the screw 500. In addition, when the screw 500 is tightened, the seizing ridges 720 of the washer 700a may slightly lodge into the bottom plate 200, and/or the seizing ridges 720 of the washer 700b may slightly lodge into the head portion 520 of the screw 500, such that the screw 500 is less likely to loosen.

In some embodiments, a lateral dimension D11 of the pair of washers 700 is smaller than the maximum width D8 of the head portion 520. In some alternative embodiments, the lateral dimension D11 of the pair of washers 700 may be equal to or larger than the maximum width D8 of the head portion 520. Although one screw 500, one anti-loosening coating 600 and one pair of washers 700 are illustrated, the number of the screw 500, the number of the anti-loosening coating 600 and the number of the pair of washers 700 may be respectively more than one. The disclosure is not limited thereto.

In view of the above, in some embodiments of the disclosure, due to the configuration of the buffer element 400, the anti-loosening coating 600 and the pair of washers 700, the screw 500 tightly fastens the bottom and top plates 200, 300 onto the semiconductor package 100. Accordingly, the loosening issue of the screw 500 may be avoided.

In accordance with some embodiments of the disclosure, a package structure includes a bottom plate, a semiconductor package, a top plate, a screw and an anti-loosening coating. The semiconductor package is disposed over the bottom plate. The top plate is disposed over the semiconductor package, and includes an internal thread in a screw hole of the top plate. The screw penetrates through the bottom plate, the semiconductor package and the top plate, and includes an external thread. The external thread of the screw is engaged to the internal thread of the top plate, and the anti-loosening coating is adhered between the external thread and the internal thread.

In accordance with some embodiments of the disclosure, a package structure includes a semiconductor package, a top plate, a bottom plate, a buffer element, a thermal interface material (TIM) and a screw. The top plate and the bottom plate are disposed on opposite sides of the semiconductor package. The buffer element is disposed between the semiconductor package and the top plate, wherein the buffer element includes an opening extending through the buffer element. The TIM is disposed in the opening of the buffer element and in contact with the semiconductor package and the top plate. The screw secures the bottom plate, the semiconductor package, the buffer element and the top plate.

In accordance with some embodiments of the disclosure, a package structure includes a first plate, a plurality of dies, a redistribution structure, a second plate, a screw and a pair of washers. The dies are disposed over the first plate and laterally encapsulated by an insulating encapsulant. The redistribution structure is disposed over the plurality of dies and the insulating encapsulant. The second plate is disposed over the redistribution structure. The screw penetrates through the first plate, the insulating encapsulant, the redistribution and the second plate, wherein the screw includes a main portion and a head portion connected to the main portion. The pair of washers sleeve the main portion of the screw and is disposed between the first plate and the head portion of the screw, wherein each washer among the pair of washers includes a first ring-shaped surface and a second ring-shaped surface opposite to the first ring-shaped surface, each washer among the pair of washers includes cams arranged on the first ring-shaped surface, each washer among the pair of washers includes seizing ridges distributed on the second ring-shaped surface, and the pair of washers join together through the cams.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first plate;
   a package, disposed over the first plate, and the package comprising a first device, an insulating encapsulant, a redistribution structure and a second device, wherein the first device is laterally encapsulated by the insulting encapsulant, the redistribution structure covers the first device and the insulating encapsulant, the second device is disposed on the redistribution structure and electrically connected to the first device through the redistribution structure;
   a second plate, disposed over the package, and the second plate comprising a screw hole;
   a buffer layer, disposed between the package and the second plate, wherein the buffer layer is not in contact with the insulating encapsulant;
   a first thermal interface material (TIM) disposed between the second device and the second plate, wherein the first TIM is laterally spaced apart from the screw by the buffer layer; and
   a screw, penetrating through the first plate, the package and the screw hole of the second plate, and the screw being engaged to the screw hole of the second plate.

2. The package structure as claimed in claim 1, wherein the buffer layer is in contact with the second device.

3. The package structure as claimed in claim 1, wherein the screw comprises an external thread, a main portion and a head portion connected to the main portion, the external thread is on an external surface of the main portion, and the first plate is between the head portion of the screw and the package.

4. The package structure as claimed in claim 3, further comprising:
   a pair of washers, sleeving the main portion of the screw, wherein the pair of washers are between the first plate and the head portion of the screw.

5. The package structure as claimed in claim 4, wherein each washer among the pair of washers comprises a first ring-shaped surface and a second ring-shaped surface opposite to the first ring-shaped surface, each washer among the pair of washers comprises cams arranged on the first ring-shaped surface, each washer among the pair of washers comprises seizing ridges distributed on the second ring-shaped surface, and the pair of washers join together through the cams.

6. The package structure as claimed in claim 1, further comprising:
   a second TIM, disposed between the package and the first plate.

7. The package structure as claimed in claim 1, further comprising:
   an anti-loosening coating adhered between the screw and the screw hole.

8. The package structure as claimed in claim 1, wherein the first TIM is in contact with the second device, and the first TIM is not in contact with the insulating encapsulant.

9. The package structure as claimed in claim 1 further comprising connecting elements disposed between the first device and the redistribution structure.

10. The package structure as claimed in claim 1, wherein the first plate or the second plate comprises a heat dissipating plate.

11. A package structure, comprising:
- a semiconductor package;
- a pair of heat dissipating plates, disposed on opposite sides of the semiconductor package;
- a buffer element, disposed between the semiconductor package and a first heat dissipating plate among the pair of heat dissipating plates, wherein the buffer element comprises an opening, wherein the opening extends through the buffer element;
- a first thermal interface material (TIM), disposed in the opening of the buffer element and in contact with the semiconductor package and the first heat dissipating plate;
- a second thermal interface material (TIM), disposed between the semiconductor package and the second heat dissipating plate;
- a screw, penetrating through the buffer element and securing a second heat dissipating plate among the pair of heat dissipating plates, the semiconductor package, the buffer element and the first heat dissipating plate; and
- a pair of washers, sleeving the screw, wherein the pair of washers are between the first heat dissipating plate and a head portion of the screw.

12. The package structure as claimed in claim 11, wherein the screw penetrates through the second heat dissipating plate, the semiconductor package, the buffer element and the first heat dissipating plate.

13. The package structure as claimed in claim 11, wherein the buffer element is in contact with the semiconductor package, the first heat dissipating plate and the first TIM.

14. The package structure as claimed in claim 11, wherein the screw further comprises a main portion connected to the head portion.

15. The package structure as claimed in claim 14, wherein the screw is spaced apart from the buffer element and the first TIM.

16. The package structure as claimed in claim 11, wherein each washer among the pair of washers comprises a first ring-shaped surface and a second ring-shaped surface opposite to the first ring-shaped surface, each washer among the pair of washers comprises cams arranged on the first ring-shaped surface, each washer among the pair of washers comprises seizing ridges distributed on the second ring-shaped surface, and the pair of washers join together through the cams.

17. A package structure, comprising:
- a first plate;
- a wafer form structure comprising a semiconductor package and a device stacked over the semiconductor package;
- a second plate, disposed over the device;
- a buffer layer in contact with the device, the buffer layer being disposed between the device and the second plate;
- a first thermal interface material (TIM) in contact with the device, the first TIM being disposed between the device and the second plate, wherein the first TIM is surrounded by and in contact with the buffer layer; and
- a screw, penetrating through the first plate, the wafer form structure and the second plate, wherein the screw comprises a main portion and a head portion connected to the main portion; and
- a pair of washers, sleeving the main portion of the screw and disposed between the first plate and the head portion of the screw, wherein each washer among the pair of washers comprises a first ring-shaped surface and a second ring-shaped surface opposite to the first ring-shaped surface, each washer among the pair of washers comprises cams arranged on the first ring-shaped surface, each washer among the pair of washers comprises seizing ridges distributed on the second ring-shaped surface, and the pair of washers join together through the cams.

18. The package structure as claimed in claim 17, wherein the device is spaced apart from the second plate by the buffer layer and the first TIM.

19. The package structure as claimed in claim 17, wherein the screw is spaced apart from the buffer layer and the first TIM.

20. The package structure as claimed in claim 17, further comprising:
- a second thermal interface material (TIM), disposed between the wafer form structure and the first plate.

* * * * *